(12) United States Patent
Brockhaus et al.

(10) Patent No.: US 11,841,252 B2
(45) Date of Patent: Dec. 12, 2023

(54) METHOD FOR DETERMINING A CONDUCTIVITY, OPERATING METHOD OF A MAGNETIC-INDUCTIVE FLOWMETER AND MAGNETIC-INDUCTIVE FLOWMETER

(71) Applicant: KROHNE Messtechnik GmbH, Duisburg (DE)

(72) Inventors: Helmut Brockhaus, Oberhausen (DE); Markus Dabrowski, Duisburg (DE)

( * ) Notice: Subject to any disclaimer, the term of this patent is extended or adjusted under 35 U.S.C. 154(b) by 0 days.

(21) Appl. No.: 17/653,964

(22) Filed: Mar. 8, 2022

(65) Prior Publication Data

US 2022/0283004 A1  Sep. 8, 2022

(30) Foreign Application Priority Data

Mar. 8, 2021  (DE) .................... 10 2021 105 516.4

(51) Int. Cl.
*G01F 1/58* (2006.01)
*G01N 27/08* (2006.01)

(52) U.S. Cl.
CPC .............. *G01F 1/584* (2013.01); *G01F 1/586* (2013.01); *G01N 27/08* (2013.01)

(58) Field of Classification Search
CPC . G01F 1/584; G01F 1/586; G01F 1/60; G01F 1/58; G01N 27/08; G01N 27/02; G01R 27/22

See application file for complete search history.

(56) References Cited

U.S. PATENT DOCUMENTS 6,369,579 B1  4/2002  Riegel
8,046,194 B2  10/2011  Rufer et al.
(Continued)

FOREIGN PATENT DOCUMENTS

DE  19844489 A1  3/2000
DE  10243748 A1  4/2003
(Continued)

OTHER PUBLICATIONS

R Padman Suvarna, K Raghavendra Rao, and K Subbarangaiah, "A simple technique for a.c. conductivity measurements", Published in Bulletin of Materials Science, vol. 25, No. 7, Dec. 2002 (Year: 2002).*

*Primary Examiner* — Peter J Macchiarolo
*Assistant Examiner* — John M Royston
(74) *Attorney, Agent, or Firm* — Patrick D. Duplessis

(57) ABSTRACT

A method for determining conductivity of a medium includes: generating a signal with first and second frequencies; feeding the signal to first and second electrodes; determining a first voltage between the first and second electrodes, a first current through the medium for the first frequency, and a first impedance from the first voltage and first current; determining a second voltage between the first and second electrodes, a second current through the medium for the second frequency, and a second impedance from the second voltage and second current; determining and comparing phases of the first and second impedances; determining a medium resistance with a first formula when the first impedance phase is smaller than the second impedance phase; determining a medium resistance with a second formula when the first impedance phase is equal to or greater than the second impedance phase; and determining conductivity of the medium using the medium resistance.

12 Claims, 3 Drawing Sheets

(56) References Cited

U.S. PATENT DOCUMENTS

| | | | |
|---|---|---|---|
| 11,237,032 B2 | 2/2022 | Brockhaus et al. | |
| 2003/0051557 A1 | 3/2003 | Ishikawa et al. | |
| 2008/0016967 A1* | 1/2008 | Schrag | G01F 25/10 |
| | | | 73/861.12 |
| 2008/0262796 A1 | 10/2008 | Rufer et al. | |
| 2020/0309579 A1 | 10/2020 | Brockhaus et al. | |

FOREIGN PATENT DOCUMENTS

| | | |
|---|---|---|
| DE | 102007014469 A1 | 9/2008 |
| DE | 102019107904 B3 | 8/2020 |
| EP | 0990894 A2 | 4/2000 |

\* cited by examiner

METHOD FOR DETERMINING A CONDUCTIVITY, OPERATING METHOD OF A MAGNETIC-INDUCTIVE FLOWMETER AND MAGNETIC-INDUCTIVE FLOWMETER

TECHNICAL FIELD

The invention relates to a method for determining a conductivity of a medium, an operating method of a magnetic-inductive flowmeter, and a magnetic-inductive flowmeter.

BACKGROUND

The method for determining a conductivity of a medium requires a controller and a measuring cell. The measuring cell has a cell constant, a first electrode and a second electrode. Thereby, the first and the second electrode are in direct contact with the medium. Accordingly, the measuring cell is a conductive measuring cell. The controller is a device.

Conductive measuring cells are sufficiently known from the prior art. A conductivity σ of a medium is measured with a conductive measuring cell by feeding an electrical signal S into the first and second electrodes, causing a voltage U to drop across the first and second electrodes and a current Ito flow through the medium. A resistance R between the first and second electrodes is then determined from the voltage and current, and the conductivity of the medium is determined from the resistance using a cell constant k of the measuring cell. The conductivity is determined according to a formula $$\sigma = \frac{k}{R}.$$

The operating method of the magnetic-inductive flowmeter requires a controller, a measuring tube, a first electrode and a second electrode. In this case, the first electrode and the second electrode are arranged on the measuring tube in direct contact with a medium in the measuring tube. Further, the controller is configured to determine a flow rate of the medium through the measuring tube using the first electrode and the second electrode.

The magnetic-inductive flowmeter includes a controller, a measuring tube, a first electrode, and a second electrode. In this regard, the first electrode and the second electrode are arranged on the measuring tube such that the first electrode and the second electrode are in direct contact with a medium in the measuring tube during operation of the magnetic-inductive flowmeter. The controller is configured to determine a flow rate of the medium through the measuring tube using the first and second electrodes.

Magnetic-inductive flowmeters are sufficiently known in the prior art. During operation, a magnetic-inductive flowmeter measures the flow of a medium through the measuring tube. A medium must have electrical conductivity for this purpose. A magnetic-inductive flowmeter usually has an electromagnet that is designed in such a way that a magnetic field generated by it at least partially penetrates the medium located in the measuring tube, and a flow of the medium in the measuring tube induces a voltage in the medium. The voltage is tapped with the first and second electrodes and is proportional to a flow velocity of the medium in the measuring tube. From the flow velocity, a volumetric flow rate of the medium through the measuring tube is determined using, for example, an internal cross-sectional area of the measuring tube, or a mass flow rate of the medium through the measuring tube is determined additionally using a density of the medium.

From the practice of determining conductivities of media with conductive measuring cells, it is known that an accuracy of a determination of a conductivity of a medium depends on the actual conductivity of the medium. Therefore, the object of the present invention is to reduce the dependence of the accuracy of a determination of a conductivity of a medium on the actual conductivity of the medium, whereby the accuracy of the determination of the conductivity of the medium is improved.

SUMMARY

The object is achieved with respect to the disclosed method for determining a conductivity of a medium. According to the invention, the controller carries out the following steps:

In one step, a signal (S) having a first frequency ($f_1$) and a second frequency ($f_2$) is generated and fed to the first and second electrodes. This signal is an electrical signal which basically has only the first and second frequencies. By feeding the signal into the first and second electrodes, the signal is present between the first and second electrodes and thus also present in the medium.

In one step, a first voltage ($U_1$) between the first and second electrodes and a first current ($I_1$) through the medium for the first frequency of the signal and a first impedance ($Z_1$) are determined from the first voltage and the first current.

In one step, a second voltage ($U_2$) between the first and second electrodes and a second current ($I_2$) through the medium for the second frequency of the signal and a second impedance ($Z_2$) are determined from the second voltage and current.

A voltage and a current determined at one frequency of the signal basically have only that frequency, even if the signal has other frequencies.

In one step, a phase ($\varphi_1$) of the first impedance and a phase ($\varphi_2$) of the second impedance are determined and compared. The impedances are determined by magnitude ($|Z_1|$, $|Z_2|$) and phase ($\varphi_1$, $\varphi_2$) or real part ($\text{Re}(Z_1)$, $\text{Re}(Z_2)$) and imaginary part ($\text{Im}(Z_1)$, $\text{Im}(Z_2)$). In one step, if the phase of the first impedance is smaller than the phase of the second impedance ($\varphi_1 < \varphi_2$), a resistance ®  of the medium is determined according to a first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)}.$$

In one step, when the phase of the first impedance is equal to or greater than the phase of the second impedance ($\varphi_1 \geq \varphi_2$), the resistance is determined according to a second formula $$R = \frac{|Z_1|}{\cos(\varphi_1)}.$$

Accordingly, the two steps described immediately above represent alternative steps to each other that are carried out depending on what the ratio of the phase of the first impedance to the phase of the second impedance is.

In one step, a conductivity of the medium is determined using the resistance and the cell constants.

By determining the resistance according to either the first or second formula in dependence on the ratio of the phase of the first impedance to the phase of the second impedance, the determination of the conductivity is more accurate than known in the prior art.

The invention is based on the finding that the variation of the phase of the impedance versus the conductivity of a medium depends on the frequency of the signal ($\varphi=f(f,\sigma)$) and that deviations between the variations of the phases at different frequencies of the signal ($\varphi_1=f(f_1,\sigma)$, $\varphi_2=f(f_2,\sigma)$) are suitable for selecting a suitable formula for determining the resistance. Further, the invention is based on finding the two suitable formulas.

In one design of the method, the controller has leads connecting the controller to the first electrode, on the one hand, and to the second electrode, on the other hand. Now, if the phase of the first impedance is less than the phase of the second impedance ($\varphi_1 < \varphi_2$), then a lead resistance of the leads is subtracted from the resistance. The additional consideration of the line resistance further improves the accuracy of the determination of the conductivity of the medium.

In a further design, the signal has a first partial signal with the first frequency and a second partial signal with the second frequency. Accordingly, the first partial signal has the first frequency and the second partial signal has the second frequency. Further, the first and the second partial signal are superimposed on each other in the time domain. This means that the first partial signal and the second partial signal occur simultaneously in at least one interval. The superposition in the time domain has the effect that a time requirement for carrying out the method is reduced compared to feeding the first and the second partial signal to the first and the second electrode in succession in time. Preferably, the first and second partial signals are each basically sinusoidal.

In a further design, a quotient of the second frequency divided by the first frequency is in a range between 1.8 and 2.2. Preferably, this quotient is in a range between 1.9 and 2.1.

Particularly preferably, this quotient is 2. A quotient having the above values is advantageous because signals, such as voltages and currents, having frequencies with such a spacing can be easily distinguished from each other by the controller. For carrying out the method, it is necessary to differentiate between signals according to their frequencies.

In a further development of the above design, the first frequency is in a range between 450 Hz and 550 Hz. Preferably, the first frequency lies in a range between 480 Hz and 520 Hz.

Particularly preferably, this frequency lies in a range between 490 Hz and 510 Hz. A first frequency with these values is advantageous because these values are easy to generate and process. For example, the controller selects 500 Hz as the first frequency and 2 as the quotient, which is why the second frequency is 1 kHz.

In a further design of the method, the signal has a signal voltage (U) and a signal current (I). Further, the controller carries out the following steps:

In one step, the signal current is impressed into the medium.

In one step, the first voltage ($U_1$) is determined by generating a first square wave signal with the first frequency and multiplying the first square wave signal by the signal voltage.

In one step, the second voltage ($U_2$) is determined by generating a second square wave signal with the second frequency and multiplying the second square wave signal by the signal voltage.

The first voltage has the first frequency, as has been explained. By multiplying the first voltage by the first square wave signal, which also has the first frequency, the first voltage is thus rectified. The subsequent steps are then carried out with the rectified voltage. Accordingly, multiplying the second voltage by the second square wave signal also rectifies the second voltage. This design is advantageous because it allows easy determination of the first and second voltages. There is no need to determine the first and second currents to the extent that they are impressed by the controller and are thus already determined from the process of generation. This design is particularly advantageous when combined with a design in which the first partial signal and the second partial signal are superimposed on each other in the time domain. This is because, then, both the time required to execute the method and an effort to determine the first and second voltages are low.

The object is achieved with respect to the disclosed operating method of a magnetic-inductive flowmeter. According to the invention, the first electrode, the second electrode and the measuring tube form a measuring cell having a cell constant for determining a conductivity of the medium. Accordingly, the magnetic-inductive flowmeter implicitly comprises a previously described conductive measuring cell. Further, according to the invention, the controller carries out the following steps:

In one step, a signal (S) having a first frequency ($f_1$) and a second frequency ($f_2$) is generated and fed into the first and second electrodes.

In one step, a first voltage ($U_1$) between the first and second electrodes and a first current ($I_1$) through the medium for the first frequency of the signal and a first impedance ($Z_1$) are determined from the first voltage and the first current.

In one step, a second voltage ($U_2$) between the first and second electrodes and a second current ($I_2$) through the medium for the second frequency of the signal and a second impedance ($Z_2$) are determined from the second voltage and the second current.

In one step, a phase ($\varphi_1$) of the first impedance and a phase ($\varphi_2$) of the second impedance are determined and compared.

In one step, if the phase of the first impedance is smaller than the phase of the second impedance ($\varphi_1 < \varphi_2$), a resistance (R) of the medium is determined according to a first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)}.$$

In one step, if the phase of the first impedance is equal to or greater than the phase of the second impedance ($\varphi_1 \geq \varphi_2$), the resistance is determined according to a second formula $$R = \frac{|Z_1|}{\cos(\varphi_1)}.$$

In one step, a conductivity of the medium is determined using the resistance and the cell constants.

Accordingly, in principle, no structural changes to the magnetic-inductive flowmeter are necessary to implement the operating method.

In one design of the operating method, a flow rate of the medium through the measuring tube is determined by the controller by carrying out a magnetic-inductive flow measurement method using the first electrode and the second electrode. Magnetic-inductive flow measurement methods are well known in the prior art. However, here, the first electrode and the second electrode are used, on the one hand, for carrying out a magnetic-inductive flow measurement method for determining a flow rate of a medium through the measuring tube and, on the other hand, in the method for determining the conductivity of the medium in the measuring tube. One advantage of this design is quite obviously that no further sensors, such as further electrodes, are required, thus reducing costs. Further electrodes in direct contact with the medium would also increase the probability of leakage of a medium in the measuring tube.

In a further development of the above design, an alternating magnetic field is generated by the controller for determining the flow rate in the electromagnetic flow measurement method. Preferably, the alternating magnetic field is a rectangular alternating field. In this case, the controller feeds the signal (S) into the first and second electrodes in a transient region of the alternating magnetic field. An advantage of using an alternating magnetic field is that such a field reduces disturbances to the determination of the flow rate, which improves the accuracy of the determination of the flow rate. A transient region of the alternating magnetic field is characterized in that no voltage induced by a flow of a medium into the first and second electrodes is determined therein for determining the flow of the medium. Accordingly, an advantage of this further development is that the electromagnetic flow measurement method is not interfered with by the method for determining the conductivity of the medium or a time period is increased in carrying out the operating method. Often, no changes to an electromagnetic flow measurement method are necessary if the method for determining the conductivity of the medium is also implemented.

In a further design, the controller comprises leads connecting the controller to the first electrode, on the one hand, and to the second electrode, on the other hand. Preferably, the controller of the magnetic-inductive flowmeter implements one of the previously described methods.

In all other respects, the explanations regarding the method apply accordingly to the operating method and vice versa.

The object is achieved with respect to the disclosed magnetic-inductive flowmeter. According to the invention, the first electrode, the second electrode and the measuring tube form a measuring cell with a cell constant for determining a conductivity of the medium.

Accordingly, the magnetic-inductive flowmeter implicitly comprises a conductive measuring cell as previously described. Further, according to the invention, the controller carries out the following steps:

In one step, a signal (S) having a first frequency ($f_1$) and a second frequency ($f_2$) is generated and injected into the first and second electrodes.

In one step, a first voltage ($U_1$) between the first and second electrodes and a first current ($I_1$) through the medium for the first frequency of the signal and a first impedance ($Z_1$) are determined from the first voltage and the first current.

In one step, a second voltage ($U_2$) between the first and second electrodes and a second current ($I_2$) through the medium for the second frequency of the signal and a second impedance ($Z_2$) are determined from the second voltage and the second current.

In one step, a phase ($\varphi_1$) of the first impedance and a phase ($\varphi_2$) of the second impedance are determined and compared.

In one step, if the phase of the first impedance is smaller than the phase of the second impedance ($\varphi_1 < \varphi_2$), a resistance (R) of the medium is determined according to a first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)}.$$

In one step, if the phase of the first impedance is equal to or greater than the phase of the second impedance ($\varphi_1 \geq \varphi_2$), the resistance is determined according to a second formula $$R = \frac{|Z_1|}{\cos(\varphi_1)}.$$

Accordingly, the two steps described immediately above represent alternative steps to each other that are carried out depending on what the ratio of the phase of the first impedance to the phase of the second impedance is.

In one step, a conductivity of the medium is determined using the resistance and the cell constants.

In one design of the magnetic-inductive flowmeter, the controller includes leads connecting the controller to the first electrode, on the one hand, and to the second electrode, on the other hand. Preferably, the controller is designed to carry out any of the methods and/or operating methods described above.

In all other respects, the explanations regarding the method and operating method apply accordingly to the magnetic-inductive flowmeter and vice versa.

BRIEF DESCRIPTION OF THE DRAWINGS

In detail, a multitude of possibilities are given for designing and further developing the method for determining a conductivity of a medium, the method for operating a magnetic-inductive flowmeter and the magnetic-inductive flowmeter. For this purpose, reference is made to the following description of a preferred embodiment in connection with the drawings.

DETAILED DESCRIPTION

Figure 1:
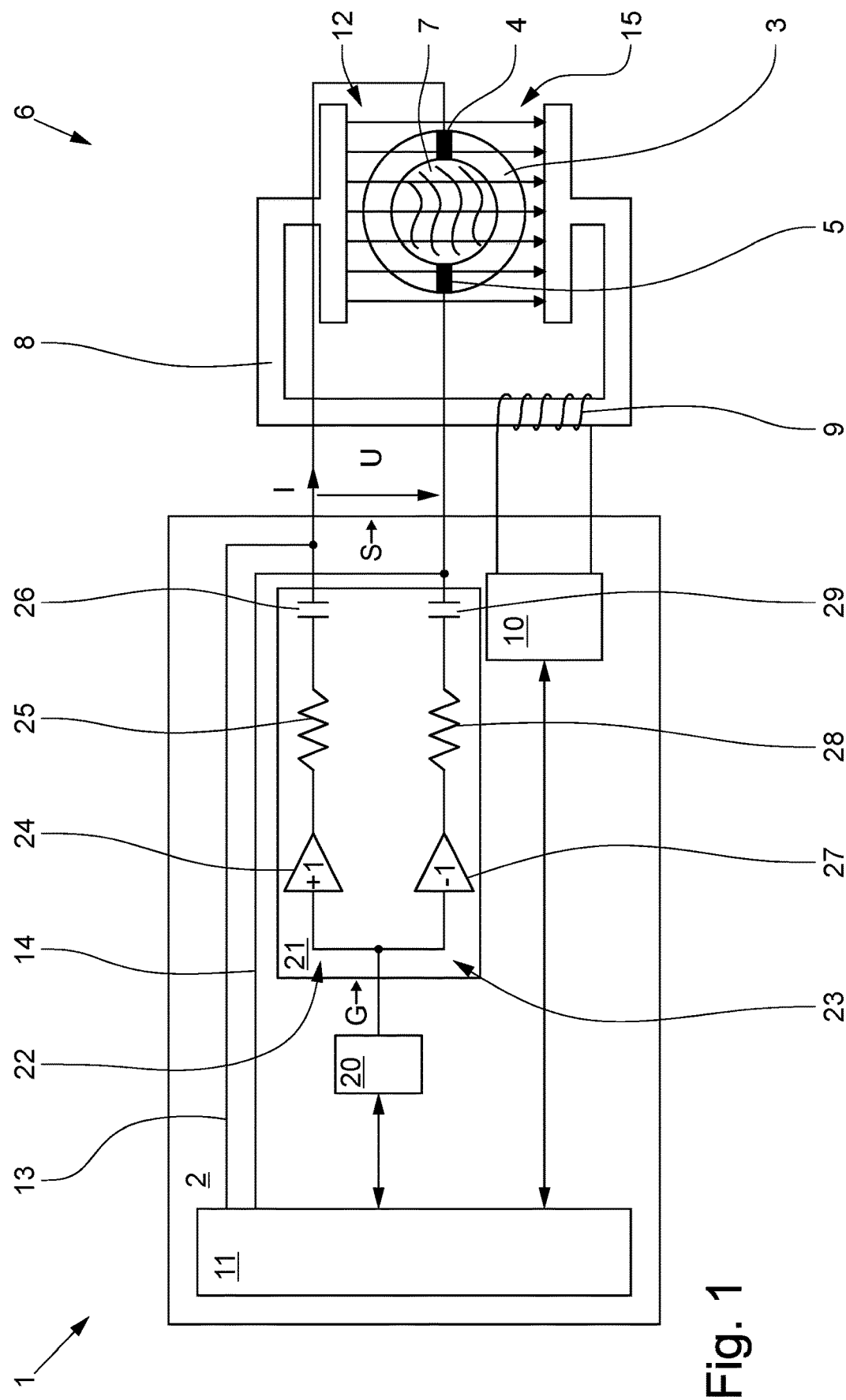
FIG. 1 illustrates an embodiment of a magnetic-inductive flowmeter.

FIG. 1 shows an embodiment of a magnetic-inductive flowmeter 1 during operation while carrying out an operating method. The magnetic-inductive flowmeter 1 has a controller 2, a measuring tube 3, a first electrode 4, a second electrode 5 and an electromagnet 6. A medium 7, which has an electrical conductivity, flows through the measuring tube 3. The first electrode 4 and the second electrode 5 are arranged on the measuring tube 3 such that the first electrode 4 and the second electrode 5 are in direct contact with the medium 7 in the measuring tube 3.

The electromagnet 6 has a yoke 8 and a coil 9 arranged around the yoke 8. The coil 9 is driven by a driver 10 and the driver 10 is controlled by a microcontroller 11, which is indicated by a double arrow in FIG. 1. The driver 10 and the microcontroller 11 are arranged in the controller 2. The electromagnet 6 is set up in such a way that a magnetic field 12 generated by it, which is indicated in FIG. 1 by a plurality of parallel arrows and has a magnetic flux density B, partially penetrates the medium 7 located in the measuring tube 3, and the flow of the medium 7 in the measuring tube 3 induces a voltage in the medium 7 which can be tapped between the first electrode 4 and the second electrode 5. The induced voltage is proportional to a flow rate of the medium 7 in the measuring tube 3.

The controller 2 has a first lead 13 and a second lead 14, wherein the first lead 13 connects the microcontroller 11 to the first electrode 4 and the second lead 14 connects the microcontroller 11 to the second electrode 5 so that the induced voltage is applied to the microcontroller 11. The microcontroller 11 is designed to evaluate the induced voltage. The first lead 13 and the second lead 14 together have a lead resistance $R_L$. In this sense, the controller 2 is connected to the first lead 13 and to the second lead 14.

The controller 2 is designed to determine a flow rate of the medium 7 through the measuring tube 3 using the first electrode 4 and the second electrode 5 during the operating method. In the present case, the operating method is designed such that a flow rate of the medium 7 through the measuring tube 3 is determined by the controller 2 by carrying out an electromagnetic flow measurement method using the first electrode 4 and the second electrode 5. In the electromagnetic flow measurement method, a rectangular alternating magnetic field having the magnetic flux density B is generated by the controller 2 for determining the flow rate. The microcontroller 11 controls the driver 10 in such a way that the square-wave magnetic field is generated. The plot of the magnetic flux density B of the magnetic square-wave field over time t is shown in the first line of the diagram in FIG. 2. Successive constant ranges of magnetic flux density B are connected by transient ranges. From the induced voltage, the microcontroller 11 first determines a flow velocity of the medium 7 in the measuring tube 3, and then from the flow velocity, using an inner cross-sectional area of the measuring tube 3, determines a volumetric flow rate of the medium 7 through the measuring tube 3.

The first electrode 4, the second electrode 5, and a portion of the measuring tube 3 form a conductive measuring cell 15 having a cell constant k for determining a conductivity σ of the medium 7. A conductivity σ of the medium 7 is determined according to the formula $$\sigma = \frac{k}{R}.$$

Figure 2:
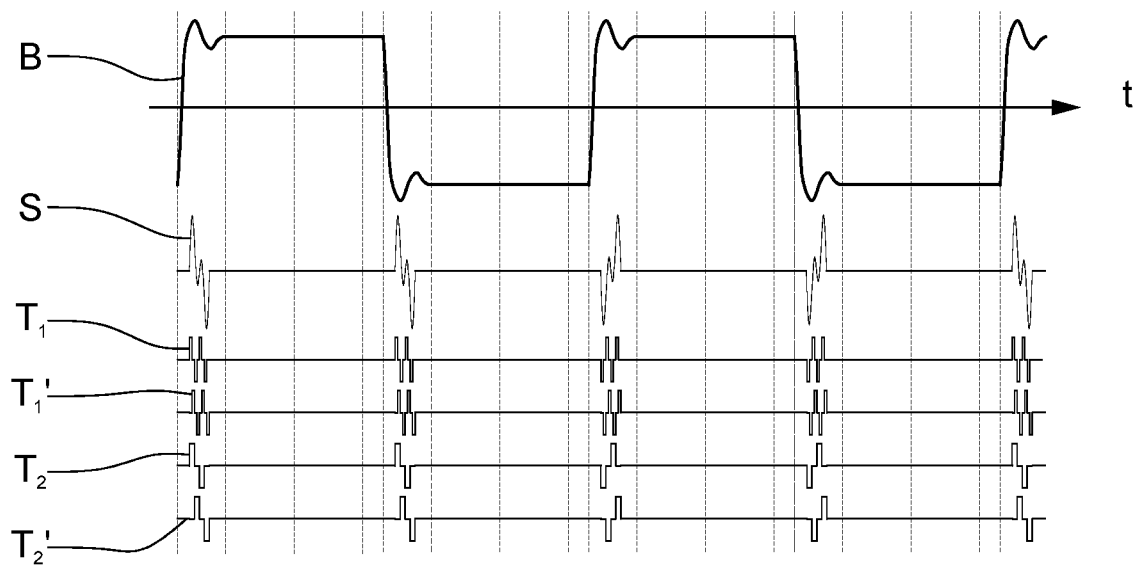
FIG. 2 illustrates a plot of signal over time of the magnetic-inductive flowmeter.
Figure 3:
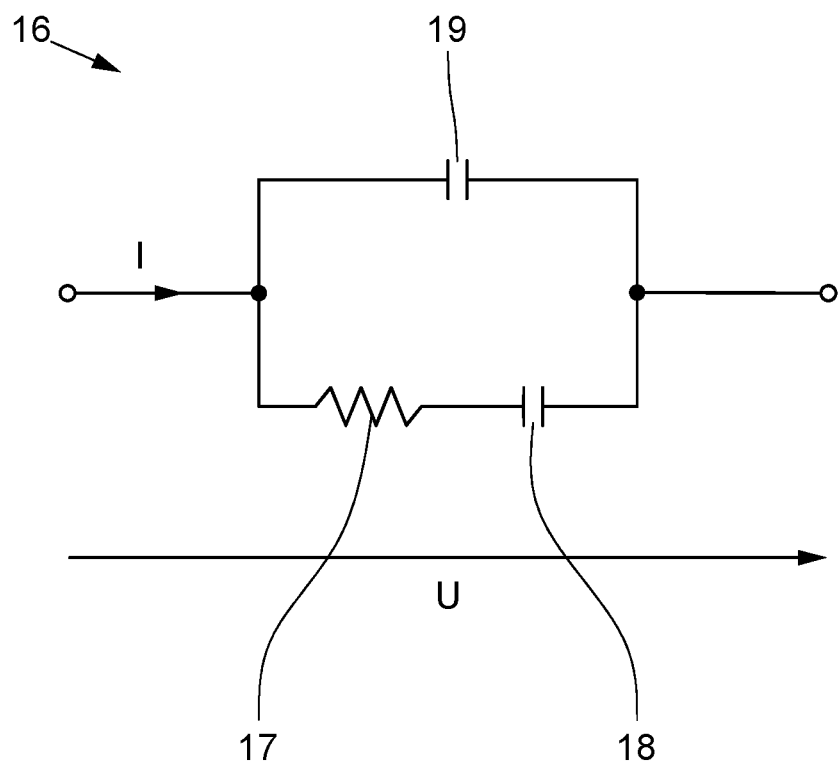
FIG. 3 illustrates an electrical equivalent circuit of a medium.

FIG. 2 shows an electrical equivalent circuit 16 for the medium 7 between the first electrode 4 and the second electrode 5. The equivalent circuit 16 is an approximation of the medium 3 for alternating signals. The equivalent circuit 16 has a parallel circuit consisting of a series circuit and a parallel capacitor 17. The series circuit has a medium resistor 18 with resistance R and a series capacitor 19. Using the resistance R and the cell constant k, the conductivity σ is determined according to the above formula. Thus, the resistance R is a resistance of the medium 7 between the first electrode 4 and the second electrode 5.

The controller 2 has a sinus wave generator 20 and a drive 21 for feeding an electrical signal S to the first electrode 4 and the second electrode 5. The sinus wave generator 20 is controlled by the microcontroller 11, which is indicated by a double arrow in FIG. 1, and is designed to generate a generator signal G having at least a first frequency $f_1$ and a second frequency $f_2$. The controller 21 has a first path 22 and a second path 23, into which the generator signal G is fed during operation. The first path 22 opens into the first lead 13 and the second path opens into the second lead 14. The first path 22 has a series circuit with a first amplifier 24, a first resistor 25 and a first capacitor 26. The first amplifier 24 has a gain of +1. The first resistor 25 and the first capacitor 26 form a first high-pass filter. The second path 23 has a second amplifier 27, a second resistor 28, and a second capacitor 29. The second amplifier 27 has a gain of −1. The second resistor 28 and the second capacitor 29 form a second high-pass filter. While the first amplifier 24 only buffers the generator signal G, it is additionally inverted by the second amplifier 27. The signal S has a signal voltage U and a signal current I. The controller 21 generates the signal S, which is a differential signal, from the generator signal G. The signal S is inverted by the second amplifier 27.

A cut-off frequency of the first high-pass filter and a cut-off frequency of the second high-pass filter are selected such that no substantial attenuation of the signal S occurs. These high-pass filters serve to prevent a DC signal from being fed into the first electrode 4 and the second electrode 5. The values of the first resistor 25 and the second resistor 28 are chosen such that the resistance R is negligible in an approximate determination of the signal current I. Namely, the signal current I is determined by the microcontroller 11, that is, the controller 2, by dividing a voltage of the generator signal G by half the value of the sum of the values of the first resistor 25 and the second resistor 26. The approximate determination of the signal current includes magnitude and phase and is sufficiently accurate for the methods described.

In addition to the electromagnetic flow measurement method previously described, the controller 2 also carries out the following steps as part of the operating method, which it is also designed to carry out:

In one step, the signal S is generated with a first frequency $f_1$=500 Hz and a second frequency $f_2$=1 kHz and is fed into the first electrode 4 and the second electrode 5. The signal S is fed in the present case by impressing the signal current I into the medium 7 via the first electrode 4 and the second electrode 5. A quotient of the second frequency $f_2$ divided by the first frequency $f_1$ is 2. For this, the sinus wave generator 20 first generates the generator signal G which has both the first frequency $f_1$ and the second frequency $f_2$. The generator signal G is then fed into the first path 22 and the second path 23 of the drive 21. The drive 21 then generates the signal S from the generator signal G, which is fed into the first electrode 4 and the second electrode 5.

The signal S has a first partial signal with the first frequency $f_1$ and a second partial signal with the second frequency $f_2$. The first partial signal and the second partial signal are superimposed in time. The second lead in FIG. 2 shows the signal S with the two temporally superimposed partial signals. The signal S is fed into the first electrode 4 and the second electrode 5 only in transient areas of the alternating magnetic field B. The signal S is not fed into the first electrode 4 and the second electrode 5. This does not impair the determination of the flow rate. Neither the quality suffers nor the duration of the determination of the flow rate increases.

In one step, a first voltage $U_1$ is determined between the first electrode 4 and the second electrode 5 and a first current $I_1$ is determined through the medium 7 for the first frequency $f_1$ of the signal S and a first impedance $Z_1$ is determined from the first voltage $U_1$ and the first current $I_1$. This step includes a substep in which the first voltage $U_1$ is determined by generating a first square-wave signal $T_1$ with the first frequency $f_1$ and multiplying the first square-wave signal $T_1$ by the signal voltage U. The first square wave signal $T_1$ also includes a copy $T_1'$ of the first square wave signal $T_1$, which has a phase shift with respect to the first square wave signal T1, preferably by 90°. The first square wave signal $T_1$ is shown in line 3 and its copy $T_1'$ is shown in line 4 of FIG. 2. Accordingly, both the first square wave signal $T_1$ and its copy $T_1'$ are multiplied by the signal voltage U so that the voltage $U_1$ is determined by magnitude and phase. The first current $I_1$ is determined according to the approximate determination described above, also by magnitude and phase. The first impedance $Z_1$ is also determined by magnitude and phase $\varphi_1$.

In one step, a second voltage $U_2$ between the first electrode 4 and the second electrode 5 and a second current $I_2$ through the medium 7 are determined for the second frequency $f_2$ of the signal S and a second impedance $Z_2$ is determined from the second voltage $U_2$ and the second current $I_2$. Also included in this step is a substep in which the second voltage $U_2$ is determined by generating a second square wave signal $T_2$ with the second frequency $f_2$ and multiplying the second square wave signal $T_2$ by the signal voltage U. The second square wave signal $T_2$ also includes a copy $T_2'$ of the second square wave signal $T_2$, which has a phase shift with respect to the second square wave signal $T_2$, preferably by 90°. The second square wave signal $T_2$ is shown in line 5 and its copy $T_2$ is shown in line 6 of FIG. 2. Accordingly, both the second square wave signal $T_2$ and its copy $T_2'$ are multiplied by the signal voltage U so that the voltage $U_2$ is determined by magnitude and phase. The second current $I_2$ is determined according to the approximate determination described earlier, also by magnitude and phase. The second impedance $Z_2$ is also determined by magnitude and phase $\varphi_2$.

In one step, the phase $\varphi_1$ of the first impedance $Z_1$ and the phase $\varphi_2$ of the second impedance $Z_2$ are compared after they have been determined.

In one step, if the phase $\varphi_1$ of the first impedance $Z_1$ is smaller than the phase $\varphi_2$ of the second impedance $Z_1$, that is, $\varphi_1 < \varphi_2$, the resistance R of the medium is determined according to the first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)} - R_L.$$

In the first formula, the lead resistance $R_L$ is also subtracted.

In one step, if the phase $\varphi_1$ of the first impedance $Z_1$ is equal to or greater than the phase $\varphi_2$ of the second impedance $Z_2$, i.e., $\varphi_1 \geq \varphi_2$, the resistance R is determined according to the second formula $$R = \frac{|Z_1|}{\cos(\varphi_1)}.$$

Figure 4:
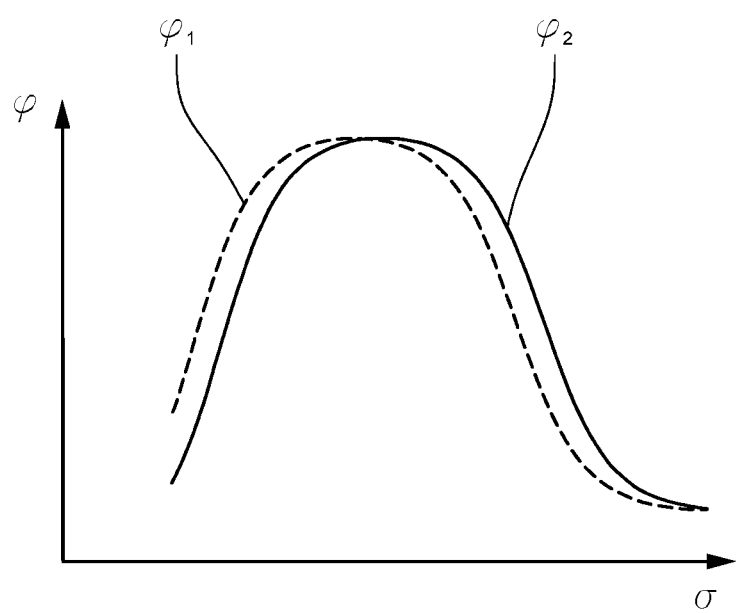
FIG. 4 illustrates a plot of phases of impedances at two different frequencies of a signal over a conductivity of a medium.

The two steps described immediately above represent alternative steps to each other, which are carried out depending on what the ratio of the phase $\varphi_1$ of the first impedance $Z_1$ to the phase $\varphi_2$ of the second impedance $Z_2$ is. FIG. 4 shows the suitability of the phase of the impedance as a selection criterion for the first or second formula. It shows, on the one hand, a plot of the phase $\varphi_1$ of the first impedance $Z_1$ over the conductivity σ and, on the other hand, a plot of the phase $\varphi_2$ of the second impedance $Z_2$ over the conductivity σ.

In one step, the conductivity σ of the medium 7 is determined using the resistance R and the cell constant k according to the formula $$\sigma = \frac{k}{R}.$$

The invention claimed is:

1. A method for determining a conductivity (σ) of a medium with a controller and a measuring cell, wherein the measuring cell has a cell constant (k), a first electrode and a second electrode, and wherein the first electrode and the second electrode are in direct contact with the medium, the method comprising the following steps carried out by the controller:
   generating a signal (S) with a first frequency ($f_1$) and a second frequency ($f_2$) and feeding the signal (S) to the first electrode and the second electrode;
   determining a first voltage ($U_1$) between the first electrode and the second electrode and a first current ($I_1$) through the medium for the first frequency ($f_1$) of the signal (S) and a first impedance ($Z_1$) from the first voltage ($U_1$) and the first current ($I_1$);
   determining a second voltage ($U_2$) between the first electrode and the second electrode and a second current ($I_2$) through the medium for the second frequency ($f_2$) of the signal (S) and a second impedance ($Z_2$) from the second voltage ($U_2$) and the second current ($U_2$);
   determining and comparing a phase ($\varphi_1$) of the first impedance ($Z_1$) with a phase ($\varphi_2$) of the second impedance ($Z_2$);
   determining, when the phase ($\varphi_1$) of the first impedance ($Z_1$) is smaller than the phase ($\varphi_2$) of the second impedance ($Z_2$), a resistance (R) of the medium according to a first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)};$$

determining, when the phase ($\varphi_1$) of the first impedance ($Z_1$) is equal to or greater than the phase ($\varphi_2$) of the second impedance ($Z_2$), the resistance (R) according to a second formula $$R = \frac{|Z_1|}{\cos(\varphi_1)};$$

and determining a conductivity (σ) of the medium using the resistance (R) and the cell constant (k).

2. The method according to claim 1, wherein the controller includes leads;
wherein the leads connect the controller to the first electrode and the second electrode; and
wherein, if the phase ($\varphi_1$) of the first impedance ($Z_1$) is smaller than the phase ($\varphi_2$) of the second impedance ($Z_2$), a lead resistance ($R_L$) of the leads is subtracted from the resistance (R).

3. The method according to claim 1, wherein the signal (S) includes a first partial signal with the first frequency ($f_1$) and a second partial signal with the second frequency ($f_2$); and
wherein the first partial signal and the second partial signal are superimposed on each other in the time domain.

4. The method according to claim 1, wherein a quotient of the second frequency ($f_2$) divided by the first frequency ($f_1$) is in a range between 1.8 and 2.2.

5. The method according to claim 4, wherein the first frequency ($f_1$) is in a range between 450 Hz and 550 Hz.

6. The method according to claim 1, wherein the signal (S) includes a signal voltage (U) and a signal current (I), and wherein the controller carries out the following steps:
impressing the signal current into the medium;
determining the first voltage ($U_1$) by generating a first square wave signal ($T_1$, $T_1'$) with the first frequency ($f_1$) and multiplying the first square wave signal ($T_1$, $T_1'$) by the signal voltage (U); and
determining the second voltage ($U_2$) by generating a second square-wave signal ($T_2$, $T_2'$) with the second frequency ($f_2$) and multiplying the second square-wave signal ($T_2$, $T_2'$) by the signal voltage (U).

7. An operating method of a magnetic-inductive flowmeter including a controller, a measuring tube, a first electrode and a second electrode, wherein the first electrode and the second electrode are arranged on the measuring tube in direct contact with a medium in the measuring tube, wherein the controller is arranged to determine a flow rate of the medium through the measuring tube using the first electrode and the second electrode wherein the first electrode, the second electrode and the measuring tube form a measuring cell having a cell constant (k) for determining a conductivity (σ) of the medium, the method comprising the following steps carried out by the controller:
generating a signal (S) with a first frequency ($f_1$) and a second frequency ($f_2$) and feeding the signal (S) to the first electrode and the second electrode;
determining a first voltage ($U_1$) between the first electrode and the second electrode and a first current ($I_1$) through the medium for the first frequency ($f_1$) of the signal (S) and a first impedance ($Z_1$) from the first voltage ($U_1$) and the first current ($I_1$);
determining a second voltage ($U_2$) between the first electrode and the second electrode and a second current ($I_2$) through the medium for the second frequency ($f_2$) of the signal (S) and a second impedance ($Z_2$) from the second voltage ($U_2$) and the second current ($I_2$);
determining and comparing a phase ($\varphi_1$) of the first impedance ($Z_1$) with a phase ($\varphi_2$) of the second impedance ($Z_2$);
determining, when the phase ($\varphi_1$) of the first impedance ($Z_1$) is smaller than the phase ($\varphi_2$) of the second impedance ($Z_2$), a resistance (R) of the medium according to a first formula $$R = \text{Re}(Z_2) - \text{Im}(Z_2) \cdot \frac{\text{Re}(Z_2) - \text{Re}(Z_1)}{\text{Im}(Z_2) - \text{Im}(Z_1)};$$

determining, when the phase ($\varphi_1$) of the first impedance ($Z_1$) is equal to or greater than the phase ($\varphi_2$) of the second impedance ($Z_2$), the resistance (R) according to a second formula $$R = \frac{|Z_1|}{\cos(\varphi_1)};$$

and
determining a conductivity (σ) of the medium using the resistance (R) and the cell constant (k).

8. The operating method according to claim 7, wherein a flow rate of the medium through the measuring tube is determined by the controller by carrying out a magnetic-inductive flow measurement method using the first electrode and the second electrode.

9. The operating method according to claim 8, wherein, in the magnetic-inductive flow measuring method, an alternating magnetic field for determining the flow is generated by the controller; and
wherein, in a transient region of the alternating magnetic field, the signal (S) is fed into the first electrode and the second electrode by the controller.

10. The operating method according to claim 7, wherein the controller includes leads:
wherein the leads connect the controller to the first electrode and the second electrode; and
wherein, if the phase ($\varphi_1$) of the first impedance ($Z_1$) is smaller than the phase ($\varphi_2$) of the second impedance ($Z_2$), a lead resistance ($R_L$) of the leads is subtracted from the resistance (R).

11. A magnetic-inductive flowmeter, comprising:
a controller;
a measuring tube;
a first electrode; and
a second electrode;
wherein the first electrode and the second electrode are arranged on the measuring tube in such a way that the first electrode and the second electrode are in direct contact with a medium in the measuring tube during operation of the magnetic-inductive measuring device;
wherein the controller is adapted to determine a flow rate of the medium through the measuring tube using the first electrode and the second electrode;
wherein the first electrode, the second electrode and the measuring tube form a measuring cell having a cell constant (k) for determining a conductivity (σ) of the medium; and
wherein the controller is designed to carries out the following steps:
generating a signal (S) with a first frequency ($f_1$) and a second frequency ($f_2$) and feeding the signal (S) into the first electrode and the second electrode;
determining a first voltage ($U_1$) between the first electrode and the second electrode and a first current ($I_1$) through the medium for the first frequency ($f_1$) of the signal (S) and a first impedance ($Z_1$) from the first voltage ($U_1$) and the first current ($I_1$);
determining a second voltage ($U_2$) between the first electrode and the second electrode and a second current ($I_2$) through the medium for the second frequency ($f_2$) of the signal (S) and a second impedance ($Z_2$) from the second voltage ($U_2$) and the second current ($I_2$);

determining and comparing a phase ($\varphi_1$) of the first impedance ($Z_1$) with a phase ($\varphi_2$) of the second impedance ($Z_2$);

determining, when the phase ($\varphi_1$) of the first impedance ($Z_1$) is smaller than the phase ($\varphi_2$) of the second impedance ($Z_2$), a resistance (R) of the medium according to a first formula $$R = \operatorname{Re}(Z_2) - \operatorname{Im}(Z_2) \cdot \frac{\operatorname{Re}(Z_2) - \operatorname{Re}(Z_1)}{\operatorname{Im}(Z_2) - \operatorname{Im}(Z_1)};$$

determining, when the phase ($\varphi_1$) of the first impedance ($Z_1$) is equal to or greater than the phase ($\varphi_2$) of the second impedance ($Z_2$), the resistance (R) according to a second formula $$R = \frac{|Z_1|}{\cos(\varphi_1)};$$

and determining a conductivity ($\sigma$) of the medium using the resistance (R) and the cell constant (k).

12. The magnetic-inductive flowmeter according to claim 11, wherein the controller includes leads;

wherein the leads connect the controller to the first electrode and the second electrode; and wherein, if the phase ($\varphi_1$) of the first impedance ($Z_1$) is smaller than the phase ($\varphi_2$) of the second impedance ($Z_2$), a lead resistance ($R_L$) of the leads is subtracted from the resistance (R).

* * * * *